(12) United States Patent
Ismail et al.

(10) Patent No.: US 8,731,504 B2
(45) Date of Patent: May 20, 2014

(54) SYSTEM AND METHOD FOR PERFORMING RF FILTERING

(75) Inventors: Aly Ismail, Costa Mesa, CA (US);
Edward Youssoufian, Irvine, CA (US);
Hassan Elwan, Lake Forest, CA (US);
Frank Carr, Newport Coast, CA (US)

(73) Assignee: Newport Media, Inc., Lake Forest, CA (US)

( * ) Notice: Subject to any disclaimer, the term of this patent is extended or adjusted under 35 U.S.C. 154(b) by 763 days.

(21) Appl. No.: 12/883,179

(22) Filed: Sep. 16, 2010

(65) Prior Publication Data
US 2011/0003573 A1  Jan. 6, 2011

Related U.S. Application Data

(63) Continuation-in-part of application No. 12/136,880, filed on Jun. 11, 2008, now Pat. No. 8,041,327, which is a continuation-in-part of application No. 11/377,721, filed on Mar. 16, 2006, now abandoned.

(51) Int. Cl.
*H04B 1/10* (2006.01)

(52) U.S. Cl.
USPC ......... 455/307; 455/234.1; 455/320; 455/550

(58) Field of Classification Search
None
See application file for complete search history.

(56) References Cited

U.S. PATENT DOCUMENTS

| 4,443,877 | A | * | 4/1984 | Chenausky et al. ........ 372/38.05 |
| 6,108,529 | A | | 8/2000 | Vice et al. |
| 6,417,737 | B1 | * | 7/2002 | Moloudi et al. .............. 330/301 |
| 6,903,606 | B1 | | 6/2005 | Yan et al. |
| 7,016,664 | B2 | | 3/2006 | Souetinov |
| 7,262,815 | B2 | | 8/2007 | Su |
| 7,460,844 | B2 | | 12/2008 | Molnar et al. |
| 7,679,431 | B2 | | 3/2010 | Chang et al. |
| 7,816,970 | B2 | | 10/2010 | Kim |
| 2003/0216128 | A1 | | 11/2003 | Zhou |
| 2004/0259519 | A1 | | 12/2004 | Su |
| 2005/0083151 | A1 | | 4/2005 | Xiao et al. |
| 2005/0087813 | A1 | * | 4/2005 | Lee et al. ...................... 257/378 |
| 2005/0164669 | A1 | * | 7/2005 | Molnar et al. ................ 455/320 |
| 2007/0230558 | A1 | | 10/2007 | Sjoland et al. |

FOREIGN PATENT DOCUMENTS

| TW | 200520379 | 6/2005 |
| TW | I237454 | 8/2005 |

OTHER PUBLICATIONS

Zhou et al., "A CMOS Passive Mixer With Low Flicker Noise for Low-Power Direct Conversion Receiver," IEEE Journal of Solid-State Circuits, vol. 40, No. 5, May 2005, pp. 1084-1093.

* cited by examiner

*Primary Examiner* — Ajibola Akinyemi
(74) *Attorney, Agent, or Firm* — Rahman LLC

(57) ABSTRACT

A method of filtering and a RF filtering circuit comprising a LO adapted to generate in-phase and quadrature LO signals; a quadrature passive mixer operatively connected to the LO; a filtering impedance operatively connected to the quadrature passive mixer, wherein the voltage at an input node of the quadrature passive mixer comprises the voltage across the filtering impedance up-converted to a frequency of a LO signal received by the quadrature passive mixer. Preferably, the voltage across the filtering impedance comprises a frequency of an input signal of the quadrature passive mixer down-converted by a frequency of the in-phase and quadrature LO signals and filtered by the filtering impedance.

14 Claims, 8 Drawing Sheets

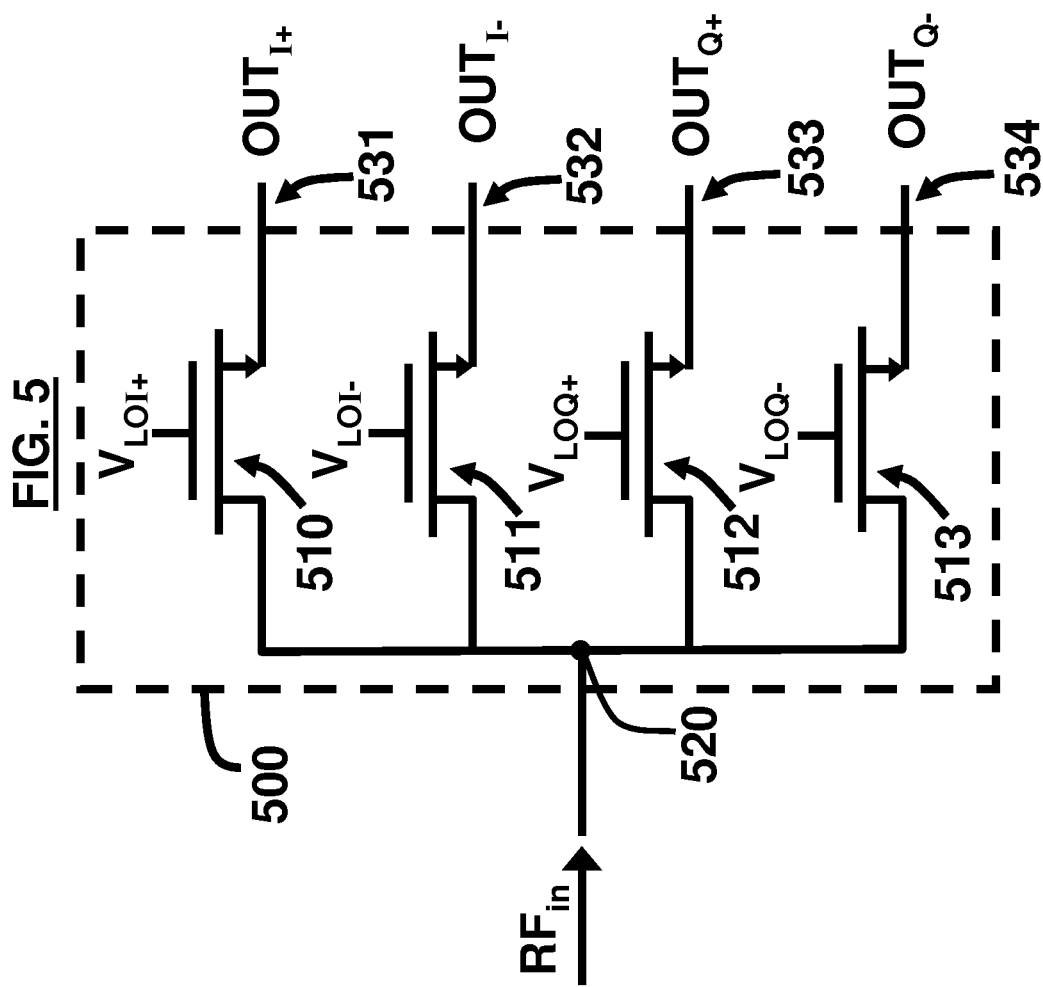

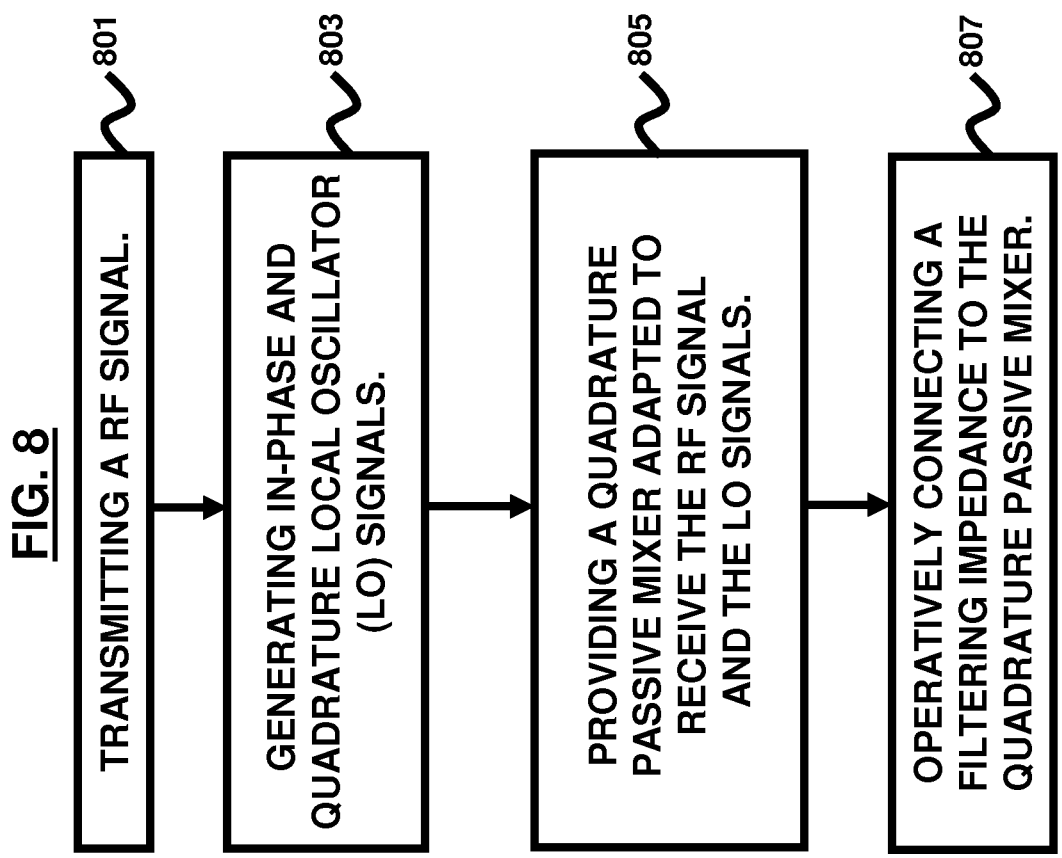

SYSTEM AND METHOD FOR PERFORMING RF FILTERING

CROSS-REFERENCE TO RELATED APPLICATIONS

This application is a continuation-in-part of U.S. application Ser. No. 12/136,880 filed Jun. 11, 2008 and entitled "Wideband Resistive Input Mixer with Noise-Cancelled Impedance", which is a continuation-in-part of U.S. application Ser. No. 11/377,721 filed Mar. 16, 2006 and entitled "System and Method for Performing RF Filtering" the complete disclosures of which, in their entireties, are herein incorporated by reference.

BACKGROUND

1. Technical Field

The embodiments herein generally relate to radio frequency (RF) technologies, and, more particularly, to filtering undesirable RF signals in a RF network using filters.

2. Description of the Related Art

The spectrum input to RF devices typically includes a large number of undesired signals in addition to the desired band of interest. Such interferences can be very large, possibly causing intermodulation distortion, desensitization, cross-band modulation, and oscillator pulling, among other undesirable effects. Most typical RF receivers require a band-limiting filter at their input to eliminate or reduce such interferences. These filters typically require very high selectivity (that is, a very narrow passband relative to the filter center frequency). In certain wide-band applications, these filters must move to track the desired channel. Typically, such "tracking" filters must be very carefully tuned or they may unintentionally attenuate the desired signal.

There are generally two conventional approaches to RF filtering. In applications where tracking is not required, an off-chip resonator such as a surface acoustic wave (SAW) filter is employed. The benefit of these filters is excellent selectivity and accurate passband location. However, the disadvantages are twofold. First, these filters generally have approximately 2 dB loss in their passband. This translates to an additional 2 dB of noise figure (NF) and thus directly affects the minimum possible sensitivity of the system. Second, these filters invariably add significant cost to the bill of material (BOM) and generally increases the circuit board area. For tracking applications, a tuning element such as a p-type intrinsic, n-type diode (PIN diode) is used to tune the resonance of a tank or similar resonant circuit. While this approach manages to provide a tunable filtering, it generally suffers from poor stopband attenuation and less passband frequency accuracy than SAW filters. Furthermore, these filters are off-chip, and again impact BOM costs. Even in the case of a tracking filter or an active notch filter, factory calibration/tuning is generally required (i.e., leading to more cost and complexity of implementation).

Accordingly, there remains a need for a high Q factor (high-Q) filter which does not require calibration and which can track the local oscillator (LO) signal and achieves large stopband attenuation.

SUMMARY

In view of the foregoing, an embodiment herein provides a RF filtering circuit comprising a LO adapted to generate in-phase and quadrature LO signals; a quadrature passive mixer operatively connected to the LO; a filtering impedance operatively connected to the quadrature passive mixer, wherein the voltage at an input node of the quadrature passive mixer comprises the voltage across the filtering impedance up-converted to a frequency of a LO signal received by the quadrature passive mixer. Preferably, the voltage across the filtering impedance comprises a frequency of an input signal of the quadrature passive mixer down-converted by a frequency of the in-phase and quadrature LO signals and filtered by the filtering impedance. Moreover, the filtering impedance preferably comprises a resistor in parallel with a capacitor. Furthermore, the filtering impedance preferably comprises a first component comprising a first resistor in parallel with a first capacitor; and a second component comprising an active impedance, wherein the first component is in parallel with the second component.

The quadrature passive mixer may comprise a plurality of metal oxide semiconductor field effect transistor (MOSFET) switches driven by the in-phase and quadrature LO signals, wherein each of the MOSFET switches are preferably connected in parallel to one another, wherein each of the MOSFET switches comprises a gate, a drain, and a source, wherein the drain of each of the MOSFET switches are operatively tied to one another for receiving a RF signal, wherein the source of each of the MOSFET switches are operatively connected to a respective the filtering impedance, and wherein the gate of each of the MOSFET switches are operatively connected to the LO for receiving the a LO signal for turning on a respective MOSFET switch.

Another embodiment provides a wireless network system comprising an antenna; a LO adapted to generate in-phase and quadrature LO signals; a quadrature passive mixer operatively connected to each of the antenna and the LO; and a filtering impedance operatively connected to the quadrature passive mixer, wherein the voltage at an input node of the quadrature passive mixer comprises the voltage across the filtering impedance up-converted to a frequency of a LO signal received by the quadrature passive mixer. Preferably, the voltage across the filtering impedance comprises a frequency of an input signal of the quadrature passive mixer down-converted by a frequency of the in-phase and quadrature LO signals and filtered by the filtering impedance. Furthermore, the filtering impedance preferably comprises a resistor in parallel with a capacitor. Additionally, the filtering impedance preferably comprises a first component comprising a first resistor in parallel with a first capacitor; and a second component comprising an active impedance, wherein the first component is in parallel with the second component. The quadrature passive mixer may comprise a plurality of MOSFET switches driven by the in-phase and quadrature LO signals.

Preferably each of the MOSFET switches are connected in parallel to one another, wherein each of the MOSFET switches comprises a gate, a drain, and a source, wherein the drain of each of the MOSFET switches are operatively tied to one another for receiving a RF signal, wherein the source of each of the MOSFET switches are operatively connected to a respective the filtering impedance, and wherein the gate of each of the MOSFET switches are operatively connected to the LO for receiving the a LO signal for turning on a respective MOSFET switch. The wireless network system may further comprise a pair of low noise amplifiers (LNAs) connected to the filtering impedance, wherein the pair of LNAs preferably comprise an in-phase channel low intermediate frequency (IF) LNA and a quadrature channel IF LNA.

Another embodiment provides a method of filtering signals in a RF wireless network, wherein the method comprises transmitting a RF signal; generating in-phase and quadrature LO signals; providing a quadrature passive mixer adapted to receive the RF signal and the LO signals; and operatively connecting a filtering impedance to the quadrature passive mixer, wherein the voltage at an input node of the quadrature passive mixer comprises the voltage across the filtering impedance up-converted to a frequency of a LO signal received by the quadrature passive mixer. Preferably, the voltage across the filtering impedance comprises a frequency of an input signal of the quadrature passive mixer down-converted by a frequency of the in-phase and quadrature LO signals and filtered by the filtering impedance.

The method may further comprise configuring the filtering impedance to filter the RF signal, wherein the filtering impedance is configured to comprise a resistor in parallel with a capacitor. Additionally, the method may further comprise configuring the filtering impedance to filter the RF signal, wherein the filtering impedance is configured to comprise a first component comprising a first resistor in parallel with a first capacitor; and a second component comprising an active impedance, wherein the first component is in parallel with the second component. Moreover, the method may further comprise configuring the quadrature passive mixer to comprise a plurality of MOSFET switches driven by the in-phase and quadrature LO signals. Additionally, the method may further comprise configuring each of the MOSFET switches to be connected in parallel to one another, wherein each of the MOSFET switches is configured to comprise a gate, a drain, and a source, wherein the drain of each of the MOSFET switches are operatively tied to one another for receiving a RF signal, wherein the source of each of the MOSFET switches are operatively connected to a respective the filtering impedance, and wherein the gate of each of the MOSFET switches are operatively connected to the LO for receiving the LO signal for turning on a respective MOSFET switch.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIGS. 2 through 5 illustrate schematic circuit diagrams according to the embodiments herein;

FIG. 8 is a flow diagram illustrating a preferred method according to an embodiment herein.

DETAILED DESCRIPTION OF PREFERRED EMBODIMENTS

Figure 1:
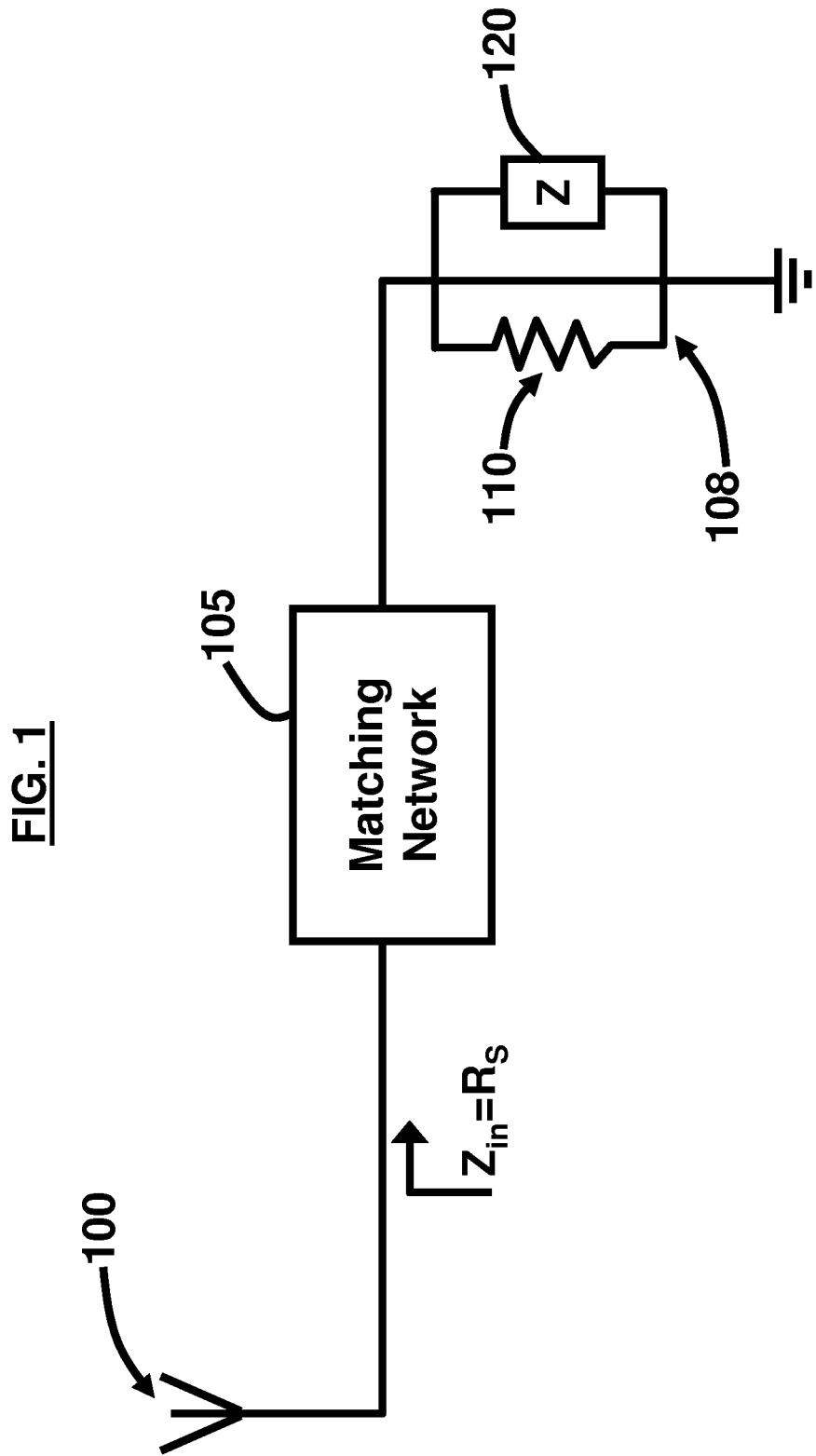
FIG. 1 is a system block diagram according to the embodiments herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As mentioned, there remains a need for a high-Q filter which does not require calibration and which can track the LO signal and achieves large stopband attenuation. The embodiments herein achieve this by providing a system and method of performing high level RF filtering by eliminating the need for a SAW filter, which improves the overall NF level (a 2 dB improvement in the NF level) and requires fewer external components, thus reducing BOM costs. Referring now to the drawings, and more particularly to FIGS. 1 through 8, where similar reference characters denote corresponding features consistently throughout the figures, there are shown preferred embodiments.

FIG. 1 illustrates a system diagram of wireless system comprising an antenna 100 adapted to receive and transmit signals to a matching network 105. In one embodiment, the matching network 105 may be formed on an integrated circuit chip. The matching network 105 typically transforms the LNA input impedance 108 (modeled as a resistor 110 and capacitor 120) to match the impedance of the antenna 100.

Figure 2:
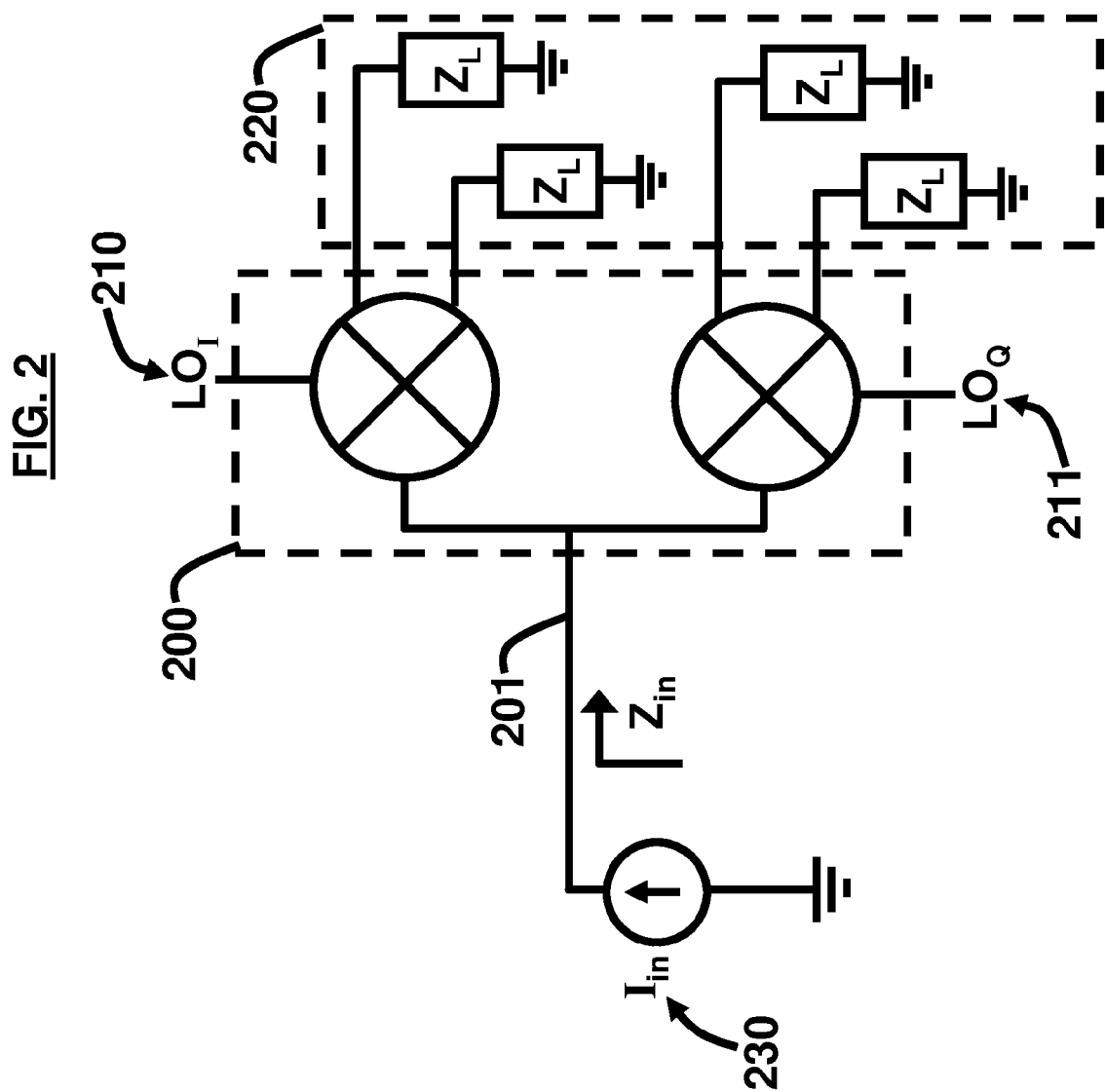

FIG. 2 illustrates a filtering circuit in accordance with an embodiment herein, which comprises a quadrature passive mixer 200 in series with a filtering impedance 220. This circuit can be integrated on a chip, and in the preferred embodiment is placed as part of the matching network 105 to the antenna 100 of FIG. 1. Here the RF input signal is taken as a current, represented by source 230. The input current is mixed down (shifted down in frequency) by a pair of mixers 200 driven by quadrature LO signals 210 and 211. Once the signal is mixed down, it is filtered and converted to a voltage by impedance 220. Finally, the voltage at impedance 220 is mixed back up to RF by the mixers 200, and defines the voltage at 201. This entire sequence of events is equivalent to the input signal being filtered at RF by the impedance 220 upconverted and centered around the LO frequency.

The circuit provided by the embodiments herein takes advantage of a non-obvious property of current-mode passive mixers as depicted in FIG. 2: the voltage at node 201 is simply the voltage across the impedances 220 up-converted to the local oscillator frequency, $\omega_{LO}$. In a preferred embodiment, the frequency, $\omega_{LO}$, is set equal to the frequency of the channel desired to be received. The voltage across impedance 220 in this case is the frequency of the entire input signal 230 down-converted by the frequency of signals 210 and 211 and filtered by the impedances 220.

Figure 3:
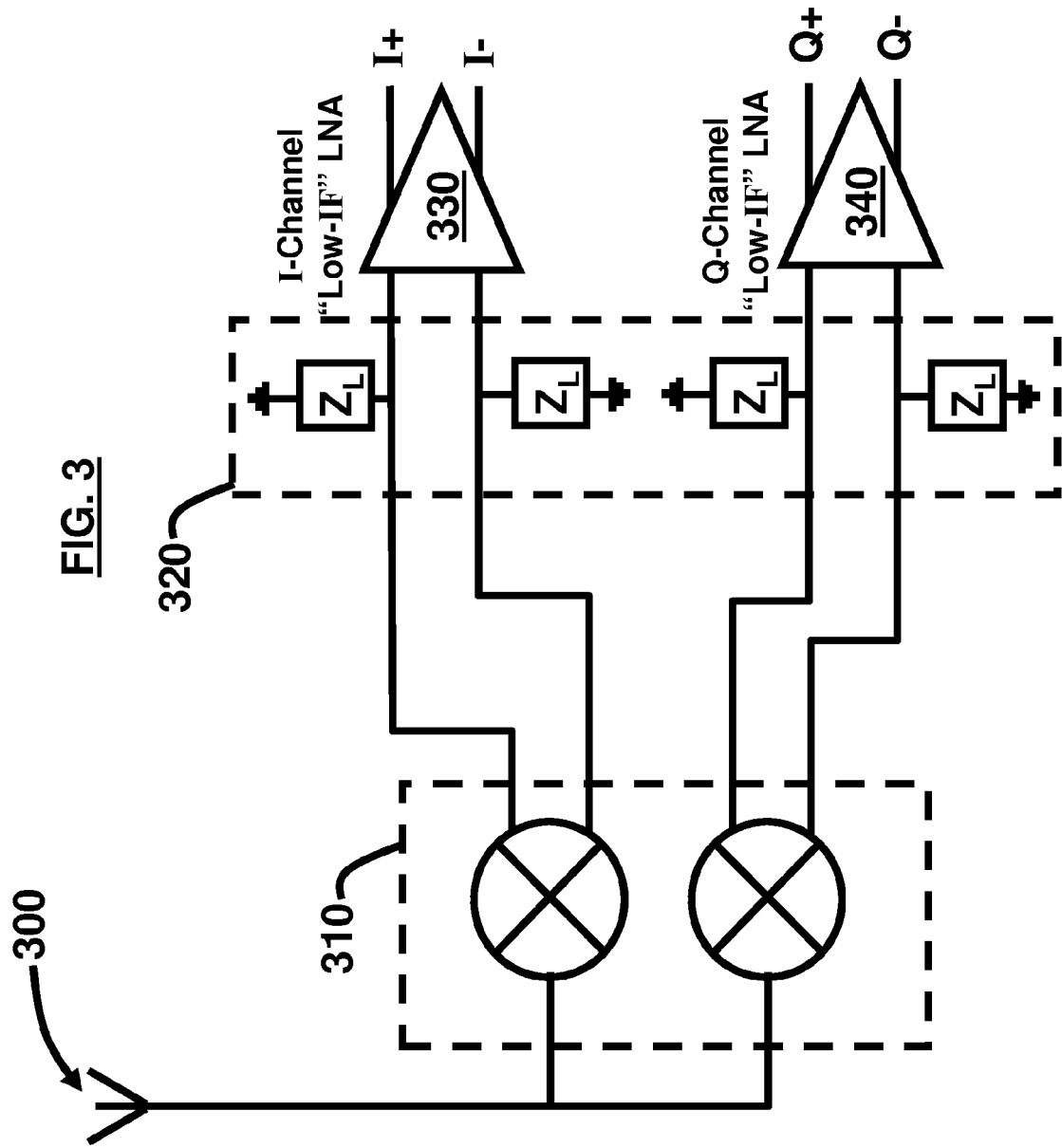

FIG. 3 illustrates an alternative embodiment, wherein an antenna 300 adapted to transmit RF signals to a quadrature passive mixer 310, which is coupled to a filtering impedance mechanism 320. The filtering impedance mechanism 320 is operatively connected to a plurality of LNAs 330, 340. The first LNA 330 comprises an in-phase (I) channel low intermediate frequency (IF) LNA, and the second LNA 340 comprises a quadrature (Q) channel IF LNA. Each of the LNAs 330, 340 output amplified I and Q signals, respectively. The mixers 310 downconvert the signal received at the antenna 300. The (current mode) mixer outputs are then simultaneously converted to voltage and filtered by the impedances 320. The voltages are then applied to amplifiers 330 and 340, which effectively act as low noise amplifiers at Baseband instead of RF.

Figure 4B:
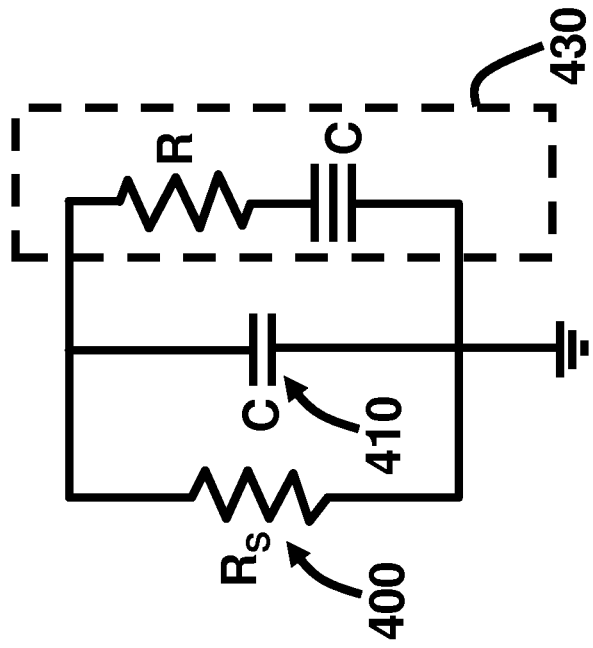
Figure 4A:
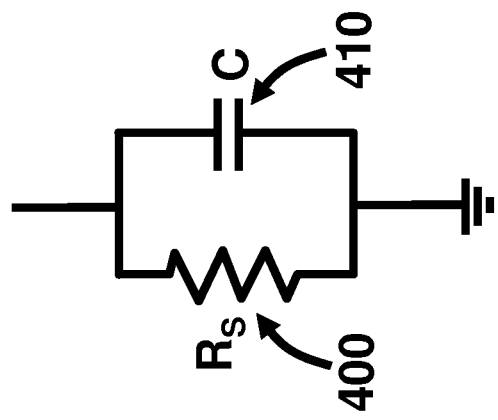

The impedances 220 can be embodied as a simple RC filter comprising resistor 400 in parallel with capacitor 410 as shown in FIG. 4(A), or a more complicated, higher order impedance such as the one depicted in FIG. 4(B), which further includes the resistor and capacitor shown in series 430.

The quadrature passive mixer 200 of FIG. 2 is preferably implemented as mechanism 500 in FIG. 5. In FIG. 5, four metal oxide semiconductor field effect transistor (MOSFET) switches 510-513 are driven by four quadrature LO phases. This occurs because the quadrature voltage waveforms are applied to the gates of the MOSFET switches 510-513. The drains of the respective MOSFET switches 510-513 are tied together to node 520, and the respective sources 531-534 of the MOSFET switches 510-513 are taken out to four identical load impedances 220 of FIG. 2.

Figure 6:
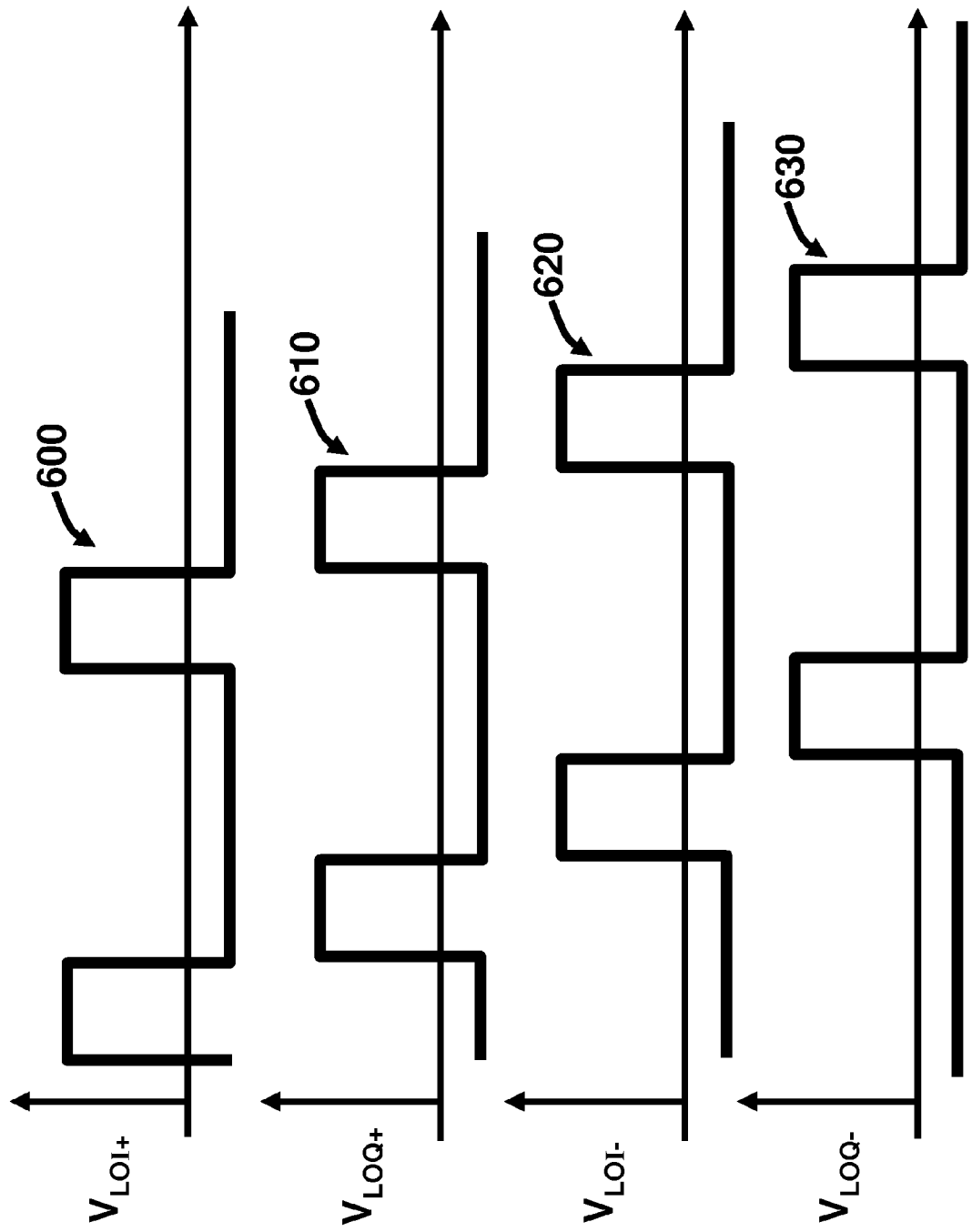
FIG. 6 is a graphical representation illustrating signal waveforms according to the embodiments herein.
Figure 7:
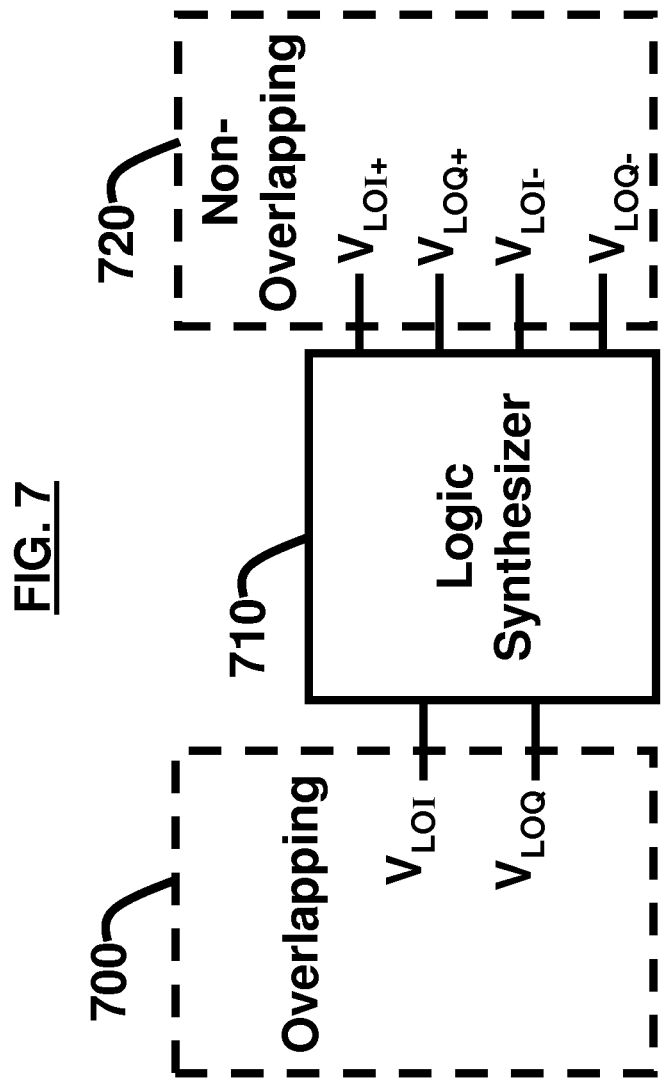
FIG. 7 is a system block diagram according to the embodiments herein.

The quadrature waveforms driving the gates of the MOSFET switches 510-513 of FIG. 5 are represented in FIG. 6, with waveforms 600-630 corresponding with MOSFET switches 510-513, respectively. As shown in FIG. 6, there are four non-overlapping phases with frequency $\omega_{LO}$ and an amplitude sufficiently large enough to fully switch the MOSFET switches 510-513 on or off. These four non-overlapping phases shown in FIG. 6 correspond with the four non-overlapping signals 720 of FIG. 7 and may be generated from overlapping quadrature signals 700 using a logic synthesizer 710.

FIG. 8 illustrates a flow diagram of a method of filtering signals in a RF wireless network according to an embodiment herein, wherein the method comprises transmitting (801) a RF signal; generating (803) in-phase and quadrature LO signals; providing (805) a quadrature passive mixer adapted to receive the RF signal and the LO signals; and operatively connecting (807) a filtering impedance to the quadrature passive mixer, wherein the voltage at an input node of the quadrature passive mixer comprises the voltage across the filtering impedance up-converted to a frequency of a LO signal received by the quadrature passive mixer. Preferably, the voltage across the filtering impedance comprises a frequency of an input signal of the quadrature passive mixer down-converted by a frequency of the in-phase and quadrature LO signals and filtered by the filtering impedance.

The method may further comprise configuring the filtering impedance to filter the RF signal, wherein the filtering impedance is configured to comprise a resistor in parallel with a capacitor. Additionally, the method may further comprise configuring the filtering impedance to filter the RF signal, wherein the filtering impedance is configured to comprise a first component comprising a first resistor in parallel with a first capacitor; and a second component comprising an active impedance, wherein the first component is in parallel with the second component. Moreover, the method may further comprise configuring the quadrature passive mixer to comprise a plurality of MOSFET switches driven by the in-phase and quadrature LO signals. Additionally, the method may further comprise configuring each of the MOSFET switches to be connected in parallel to one another, wherein each of the MOSFET switches is configured to comprise a gate, a drain, and a source, wherein the drain of each of the MOSFET switches are operatively tied to one another for receiving a RF signal, wherein the source of each of the MOSFET switches are operatively connected to a respective the filtering impedance, and wherein the gate of each of the MOSFET switches are operatively connected to the LO for receiving the LO signal for turning on a respective MOSFET switch.

The embodiments provide a method for performing filtering at RF frequencies (i.e., in the range of hundreds of MHz to hundreds of GHz). The embodiments can be used to eliminate off-chip SAW filters while allowing for channel selection. Elimination of the SAW filter has a significant design and performance impact: less external components (lower BOM costs) and 2 dB improvement in the NF. The embodiments herein are applicable to both static and tracking filters. They combine the accuracy and attenuation benefits of the SAW filter approach without degrading NF and allow for tuning.

Furthermore, the embodiments can be used anywhere frequency selectivity is needed at high frequencies. In one example, the embodiments herein may be used to replace an off-chip SAW filter as the band select filter in front of an RF receiver. The embodiments herein may be part of a larger receiver, but need not be. For example, the embodiments could be used as a stand alone circuit.

The embodiments herein are applicable to both static and tracking filters. Furthermore, as mentioned, the embodiments combine the accuracy and attenuation benefits of the SAW filter approach without degrading NF and allowing for tuning. Generally, in one embodiment a circuit is provided comprising a switch in series with a filtering network. The overall network can be integrated on chip, and in the preferred embodiment is placed as part of the matching network to an antenna in a wireless system.

The techniques provided by the embodiments may be implemented in an integrated circuit chip (not shown). The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A radio frequency (RF) filtering circuit comprising:
 a local oscillator (LO) adapted to generate in-phase and quadrature LO signals;
 a pair of quadrature passive mixers each driven by a quadrature LO signal and operatively connected to said LO; and
 a filtering impedance independently and operatively connected to each of the quadrature passive mixers,
 wherein the voltage at an input node of each of said quadrature passive mixers comprises the voltage across said filtering impedance up-converted to a frequency of a LO signal received by each of said quadrature passive mixers, wherein said pair of quadrature passive mixers comprise a plurality of metal oxide semiconductor field effect transistor (MOSFET) switches driven by said in-phase and quadrature LO signals, wherein each of said MOSFET switches are connected in parallel to one another, wherein each of said MOSFET switches comprises a gate, a drain, and a source, wherein said drain of each of said MOSFET switches are operatively tied to one another for receiving a RF signal, wherein said source of each of said MOSFET switches are operatively connected to a respective said filtering impedance, and wherein said gate of each of said MOSFET switches are operatively connected to said LO for receiving said LO signal for turning on a respective MOSFET switch.

2. The RF filtering circuit of claim 1, wherein said voltage across said filtering impedance comprises a frequency of an input signal of each of said quadrature passive mixers down-converted by a frequency of said in-phase and quadrature LO signals and filtered by said filtering impedance.

3. The RF filtering circuit of claim 1, wherein said filtering impedance comprises a resistor in parallel with a capacitor.

4. The RF filtering circuit of claim 1, wherein said filtering impedance comprises:
 a first component comprising a first resistor in parallel with a first capacitor; and a second component comprising an active impedance,
 wherein said first component is in parallel with said second component.

5. A wireless network system comprising:
 an antenna;
 a local oscillator (LO) adapted to generate in-phase and quadrature LO signals;
 a pair of quadrature passive mixers each driven by a quadrature LO signal and operatively connected to each of said antenna and said LO; and
 a filtering impedance independently and operatively connected to each of said quadrature passive mixers,
 wherein the voltage at an input node of each of said quadrature passive mixers comprises the voltage across said filtering impedance up-converted to a frequency of a LO signal received by each of said quadrature passive mixers, wherein each of said quadrature passive mixers comprises a plurality of metal oxide semiconductor field effect transistor (MOSFET) switches driven by said in-phase and quadrature LO signals, wherein each of said MOSFET switches are connected in parallel to one another, wherein each of said MOSFET switches comprises a gate, a drain, and a source, wherein said drain of each of said MOSFET switches are operatively tied to one another for receiving a RF signal, wherein said source of each of said MOSFET switches are operatively connected to a respective said filtering impedance, and wherein said gate of each of said MOSFET switches are operatively connected to said LO for receiving said LO signal for turning on a respective MOSFET switch.

6. The wireless network system of claim 5, wherein said voltage across said filtering impedance comprises a frequency of an input signal of each of said quadrature passive mixers down-converted by a frequency of said in-phase and quadrature LO signals and filtered by said filtering impedance.

7. The wireless network system of claim 5, wherein said filtering impedance comprises a resistor in parallel with a capacitor.

8. The wireless network system of claim 5, wherein said filtering impedance comprises:
 a first component comprising a first resistor in parallel with a first capacitor; and
 a second component comprising an active impedance,
 wherein said first component is in parallel with said second component.

9. The wireless network system of claim 5, further comprising a pair of low noise amplifiers (LNAs) connected to said filtering impedance.

10. The wireless network system of claim 9, wherein said pair of LNAs comprise an in-phase channel low intermediate frequency (IF) LNA and a quadrature channel IF LNA.

11. A method of filtering signals in a radio frequency (RF) wireless network, said method comprising:
 transmitting a RF signal;
 generating in-phase and quadrature local oscillator (LO) signals;
 providing a pair of quadrature passive mixers each driven by a quadrature LO signal and adapted to receive said RF signal and said LO signals;
 configuring each of the quadrature passive mixers to comprise a plurality of metal oxide semiconductor field effect transistor (MOSFET) switches driven by said in-phase and quadrature LO signals;
 independently and operatively connecting a filtering impedance to each of said mixers, wherein the voltage at an input node of each of said pair of quadrature passive mixers comprises the voltage across said filtering impedance up-converted to a frequency of a LO signal received by said pair of quadrature passive mixers; and
 configuring each of said MOSFET switches to be connected in parallel to one another, wherein each of said MOSFET switches is configured to comprise a gate, a drain, and a source, wherein said drain of each of said MOSFET switches are operatively tied to one another for receiving a RF signal, wherein said source of each of said MOSFET switches are operatively connected to a respective said filtering impedance, and wherein said gate of each of said MOSFET switches are operatively connected to a LO for receiving said LO signal for turning on a respective MOSFET switch.

12. The method of claim 11, wherein said voltage across said filtering impedance comprises a frequency of an input signal of each of said quadrature passive mixers down-converted by a frequency of said in-phase and quadrature LO signals and filtered by said filtering impedance.

13. The method of claim 11, further comprising configuring said filtering impedance to filter said RF signal, wherein said filtering impedance is configured to comprise a resistor in parallel with a capacitor.

14. The method of claim 11, further comprising configuring said filtering impedance to filter said RF signal, wherein said filtering impedance is configured to comprise:
- a first component comprising a first resistor in parallel with a first capacitor; and
- a second component comprising an active impedance, wherein said first component is in parallel with said second component.

\* \* \* \* \*